(12) United States Patent
Kumaki et al.

(10) Patent No.: US 7,622,243 B2
(45) Date of Patent: Nov. 24, 2009

(54) PHOTOSENSITIVE ELEMENT, RESIST PATTERN FORMATION METHOD AND PRINTED WIRING BOARD PRODUCTION METHOD

(75) Inventors: Takashi Kumaki, Hitachi (JP); Masahiro Miyasaka, Hitachi (JP); Yasuhisa Ichihashi, Hitachi (JP); Toshiki Ito, Hitachi (JP); Makoto Kaji, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 275 days.

(21) Appl. No.: 10/572,859

(22) PCT Filed: Sep. 17, 2004

(86) PCT No.: PCT/JP2004/013677

§ 371 (c)(1), (2), (4) Date: Jan. 11, 2007

(87) PCT Pub. No.: WO2005/029188

PCT Pub. Date: Mar. 31, 2005

(65) Prior Publication Data

US 2007/0105036 A1    May 10, 2007

(30) Foreign Application Priority Data

Sep. 24, 2003   (JP) ............................. 2003-331461

(51) Int. Cl.
G03F 7/00 (2006.01)
G03F 7/04 (2006.01)

(52) U.S. Cl. ............... 430/281.1; 430/270.1; 430/905; 430/913; 430/914; 430/270.15; 430/311; 430/314

(58) Field of Classification Search ........... None
See application file for complete search history.

(56) References Cited

U.S. PATENT DOCUMENTS 4,298,738 A * 11/1981 Lechtken et al. ............... 546/22

(Continued)

FOREIGN PATENT DOCUMENTS

CN    1334301    2/2002

(Continued)

OTHER PUBLICATIONS machine translation of JP 2001-201851.*

(Continued)

*Primary Examiner*—Amanda C. Walke
(74) *Attorney, Agent, or Firm*—Antonelli, Terry, Stout & Kraus, LLP.

(57) ABSTRACT

The present invention is a photosensitive element including a support and a photosensitive resin composition layer composed of a photosensitive resin composition containing (A) a binder polymer, (B) a photopolymerizable compound, and (C) a photopolymerization initiator, wherein,
the photosensitive resin composition contains a thioxanthone-based compound represented by the following general formula (I) as the component (C), and
when the parts by weight of the thioxanthone-based compound relative to 100 parts by weight for the total weight of the component (A) and the component (B) is taken to be P, and the film thickness of the photosensitive resin composition layer is taken to be Q (μm), then R, which is the product of P and Q, satisfies the condition of the following formula (1). In the following general formula (I), $R^1$ to $R^8$ represent a hydrogen atom, halogen atom or hydrocarbon group.

$$25.5 \leq R \leq 79.0 \quad (1)$$

[Chemical Formula I]

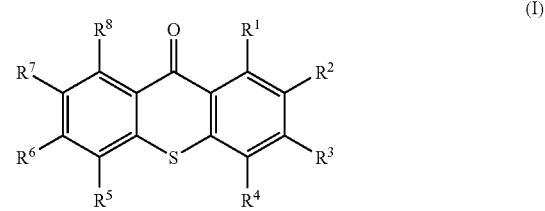

(I)

19 Claims, 4 Drawing Sheets

U.S. PATENT DOCUMENTS

| | | | | |
|---|---|---|---|---|
| 4,710,523 | A | * | 12/1987 | Lechtken et al. ............... 522/14 |
| 7,148,382 | B2 | * | 12/2006 | Wolf et al. .................... 568/14 |
| 7,230,122 | B2 | * | 6/2007 | Liu et al. ..................... 549/27 |
| 2004/0204613 | A1 | * | 10/2004 | Wolf et al. .................... 568/14 |
| 2005/0165141 | A1 | * | 7/2005 | Wolf et al. .................... 524/99 |

FOREIGN PATENT DOCUMENTS

| | | |
|---|---|---|
| CN | 1358281 | 7/2002 |
| JP | 01-159637 | 6/1989 |
| JP | 02-035454 | 2/1990 |
| JP | 02-062545 | 3/1990 |
| JP | 02-113251 | 4/1990 |
| JP | 02-161437 | 6/1990 |
| JP | 02-161441 | 6/1990 |
| JP | 07-248623 | 9/1995 |
| JP | 11-327137 | 11/1999 |
| JP | 2001-133968 | 5/2001 |
| JP | 2001-201851 | 7/2001 |
| JP | 2002-351086 | 12/2002 |
| JP | 2003-262956 | 9/2003 |

OTHER PUBLICATIONS machine translation of JP 2001-133968.*

A. Ishikawa, "Feature: Pattern Forming Technology for Realizing Next-Generation Printed Wiring Boards—Mask-less Exposure for Shorter Development Times/Optimization for Mass-Production", *Electronics Mounting Technology*, Ball Semiconductor Incorporated, pp. 74-79, Jun. 2002 Edition (vol. 18, No. 6).

Chinese Official Action issued on Mar. 6, 2009, in Chinese Application No. 2004800275719.

* cited by examiner

PHOTOSENSITIVE ELEMENT, RESIST PATTERN FORMATION METHOD AND PRINTED WIRING BOARD PRODUCTION METHOD

TECHNICAL FIELD

The present invention relates to a photosensitive element, a resist pattern formation method, and a printed wiring board production method.

BACKGROUND ART

Photosensitive elements obtained by using a photosensitive resin composition layer along with a support and protective film have been widely used in the prior art as resist materials used in etching treatment or plating treatment in the production of printed wiring boards.

Printed wiring boards are produced by a method consisting of, for example, laminating a photosensitive element onto a copper-clad laminated substrate, exposing a pattern and removing the portion other than the exposed portion with a developing solution, followed by forming a pattern by carrying out etching treatment or plating treatment and separating and removing the cured portion from the substrate.

Mercury lamps have mainly been used for the light source for pattern exposure. However, since the light from a mercury lamp contains ultraviolet rays (light having a wavelength of 400 nm or less) that are harmful to the human body, it had problems in terms of work safety. Although there are also exposure methods that use a visible light laser for the light source, this method requires the use of a resist that is sensitive to visible light, and these resists have limitations on the environment in which exposure can be carried out, such as having to be handled in a darkroom or under a red lamp.

In consideration of the above, light from which 99.0% or more of the light having a wavelength of 365 nm or less from a light source, such as that from a mercury lamp light source is cut off using a filter has come to be used for pattern exposure. In addition, gallium nitride-based blue laser light sources, which generate light having a wavelength of 400 to 415 nm and have a long service life and high output, have come to be able to be acquired inexpensively in recent years, and these are also used as light sources for pattern exposure.

Moreover, a method has recently been proposed in which exposure is carried out using a direct writing method in which the exposure light is in the form of an image by arranging a plurality of mirrors and changing the angle of each mirror as necessary (see, for example, Non-Patent Document 1). In this exposure device as well, light from which 99.5% or more of the light having a wavelength of 365 nm or less from a mercury lamp light source is cut off by using a filter or a gallium nitride-based semiconductor laser light source may be used. [Non-Patent Document 1] Electronics Mounting Technology, June 2002 Edition (p. 74-79)

DISCLOSURE OF THE INVENTION

Problems to be Solved by the Invention

Photosensitive elements of the prior art are designed to accommodate all wavelengths of exposure light from a mercury lamp light source centering on light having a wavelength of 365 nm. Consequently, since conventional photosensitive resin composition layers have a small value for optical density (referred to as the O.D. value) with respect to light having a wavelength of 400 to 450 nm, and are unable to adequately absorb light as a result of this, they are unable to initiate photopolymerization and have the problem of low sensitivity. In the case of light from which 90% or more of light having a wavelength of 365 nm or less from a light source such as a mercury lamp light source is cut off or exposure light using a gallium nitride-based semiconductor laser light source or blue laser light source that generates light having a wavelength of 400 to 415 nm in particular (to be referred to as wavelength 400-450 nm light), photosensitive resin compositions of the prior art have low sensitivity and inadequate resolution.

In addition, although it is necessary to increase the blended amount of photopolymerization initiator to achieve high sensitivity, in this case, the cross-sectional shape of the formed resist ends up being that of an inverted trapezoid, resulting in the problem of the occurrence of a discrepancy between the wiring pattern subsequently formed by etching treatment or plating treatment and the pattern that is exposed. Here, the above-mentioned inverted trapezoid shape refers to the cross-sectional shape of the resist being trapezoidal, and the width of the resist pattern becoming smaller moving from the surface thereof towards the substrate interface.

Means for Solving the Problems

With the foregoing in view, an object of the present invention is to provide a photosensitive element having superior sensitivity and resolution with respect to exposure by light having a wavelength of 400 to 450 nm in particular and having a rectangular shape for the cross-sectional shape of the developed resist, a resist pattern formation method, and a printed wiring board production method.

Disclosure of the Invention

As a result of conducting detailed studies, the inventors of the present invention found that the use of a specific thioxanthone-based compound having relatively large absorption with respect to light of a specific wavelength as a photopolymerization initiator, and adjustment of the blended amount of the thioxanthone-based compound and film thickness of a photosensitive resin composition layer, are effective for achieving the above-mentioned object. Moreover, as a result of conducting additional studies, the inventors of the present invention found that in the case the product of the blended amount and the film thickness satisfies a predetermined range, the above-mentioned object can be achieved, thereby leading to completion of the present invention.

Namely, the present invention relates to a photosensitive element at least comprising: a support, and a photosensitive resin composition layer provided on the support and composed of a photosensitive resin composition containing (A) a binder polymer, (B) a photopolymerizable compound having one or more polymerizable ethylenic unsaturated bonds in a molecule thereof, and (C) a photopolymerization initiator; wherein, the photosensitive resin composition contains a thioxanthone-based compound represented by the following general formula (I) as the component (C):

[Chemical Formula 1]

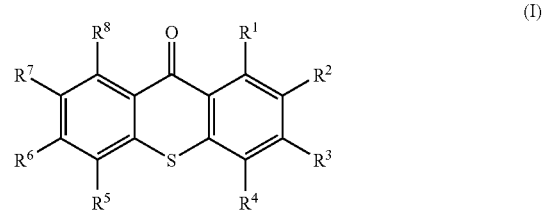

(I)

(in formula (I), $R^1$, $R^2$, $R^3$, $R^4$, $R^5$, $R^6$, $R^7$ and $R^8$ respectively and independently represent a hydrogen atom, halogen atom or hydrocarbon group), and when the parts by weight of the thioxanthone-based compound relative to 100 parts by weight for the total weight of the component (A) and the component (B) is taken to be P, and the film thickness of the photosensitive resin composition layer is taken to be Q (μm), then R, which is the product of P and Q, satisfies the condition of the following formula (1).

$$25.5 \leq R \leq 79.0 \tag{1}$$

In addition, the present invention relates to a photosensitive element wherein the weight average molecular weight of the (A) binder polymer is 5,000 to 300,000.

In addition, the present invention relates to a photosensitive element wherein the (B) photopolymerizable compound has a bisphenol A-type (meth)acrylate compound for its essential component.

In addition, the present invention relates to a photosensitive element wherein the (B) photopolymerizable compound has a compound having one ethylenic unsaturated bond in a molecule thereof and a compound having two or more ethylenic unsaturated bonds in a molecule thereof for its essential components.

In addition, the present invention relates to a photosensitive element wherein the (C) photopolymerization initiator contains a 2,4,5-triarylimidazole dimer.

In addition, the present invention relates to a photosensitive element wherein the (C) photopolymerization initiator contains an acylphosphine oxide compound represented by the following general formula (II):

[Chemical Formula 2]

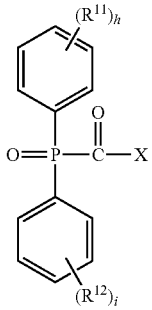

(II)

(in formula (II), X, $R^{11}$ and $R^{12}$ respectively and independently represent a monovalent organic group, and h and i respectively and independently represent an integer of 0 to 5).

In addition, the present invention relates to a photosensitive element wherein the acylphosphine oxide compound represented by the above-mentioned general formula (II) is an acylphosphine oxide compound represented by the following general formula (III):

[Chemical Formula 3]

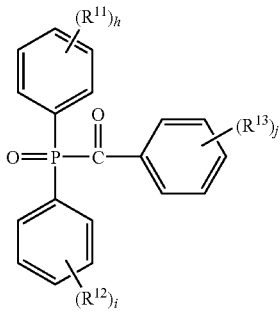

(III)

(in formula (III), $R^{11}$, $R^{12}$ and $R^{13}$ respectively and independently represent a monovalent organic group, and h, i and j respectively and independently represent an integer of 0 to 5).

In addition, the present invention relates to a photosensitive element wherein R satisfies the condition of the following formula (2).

$$28.0 \leq R \leq 77.0 \tag{2}$$

In addition, the present invention relates to a photosensitive element wherein R satisfies the condition of the following formula (3).

$$31.2 \leq R \leq 75.0 \tag{3}$$

In addition, the present invention relates to a photosensitive element that is exposed to light in which the area integrated intensity a at a wavelength of 400 to 450 nm in the oscillation spectrum of a light source is 10 times or more the area integrated intensity b at a wavelength of 300 nm to less than 400 nm.

In addition, the present invention relates to a photosensitive element that is exposed to light at a wavelength of 400 to 415 nm.

In addition, the present invention relates to a photosensitive element that is exposed to light emitted from a gallium nitride-based semiconductor laser.

In addition, the present invention relates to a photosensitive element that is exposed to light emitted from a blue laser.

In addition, the present invention relates to a photosensitive element exposed to light in which 90% or more of light having a wavelength of 365 nm or less emitted by the light source is cut off.

In addition, the present invention relates to a photosensitive element that is exposed by a direct writing method in which exposure light is in the form of an image by arranging a plurality of mirrors and changing the angle of each mirror as necessary.

In addition, the present invention relates to a resist pattern formation method at least comprising: a laminating step of laminating a photosensitive resin composition layer of a photosensitive element on a substrate for circuit formation, a exposing step of forming an exposed portion by radiating light onto a predetermined portion of the photosensitive resin composition layer, and a developing step of removing the portion other than the exposed portion of the photosensitive resin composition layer.

In addition, the present invention relates to a printed wiring board production method comprising: carrying out etching treatment or plating treatment on a substrate for circuit formation on which a resist pattern has been formed by the above-mentioned resist pattern formation method.

Effect of the Invention

In the photosensitive element, resist pattern formation method and printed wiring board production method of the present invention, sensitivity and resolution are superior with respect to exposure by light having a wavelength of 400 to 450 nm in particular, and the cross-sectional shape of the developed resist is rectangular.

EXPLANATION OF SYMBOLS

1: Photosensitive element, 11: Support, 12: Photosensitive resin composition layer, 13: Protective film Best Mode for Carrying Out the Invention The following provides a detailed explanation of embodiments of the present invention with reference to the drawings depending on the case. Furthermore, in the present invention, (meth)acrylic acid refers to acrylic acid and its corresponding methacrylic acid, (meth)acrylate refers to acrylate and its corresponding methacrylate, and a (meth)acryloyl group refers to an acryloyl group and its corresponding methacryloyl group.

Figure 1:
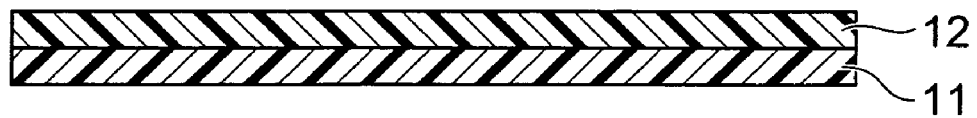
FIG. 1 is a schematic cross-sectional view showing a preferable embodiment of a photosensitive element of the present invention.

FIG. 1 is a schematic cross-sectional view showing a preferable embodiment of a photosensitive element of the present invention. A photosensitive element 1 of the present invention is at least provided with a support 11, and a photosensitive resin composition layer 12 provided on the support 11 and composed of a photosensitive resin composition.

The photosensitive resin composition that forms the photosensitive resin composition layer 12 contains (A) a binder polymer, (B) a photopolymerizable compound having one or more polymerizable ethylenic unsaturated bonds in a molecule thereof, and (C) a photopolymerization initiator.

Examples of the (A) binder polymer include an acrylic-based resin, styrene-based resin, epoxy-based resin, amide-based resin, amidoepoxy-based resin, alkyd-based resin and phenol-based resin. From the standpoint of alkaline development, an acrylic-based resin is preferable. These can be used alone or in combinations of two or more.

The (A) binder polymer can be produced by, for example, radical polymerizing a polymerizable monomer. Examples of the polymerizable monomer include polymerizable styrene derivatives such as styrene, vinyl toluene, α-methyl styrene, p-methyl styrene and p-ethyl styrene, acrylamide, acrylonitrile, esters of vinyl alcohol such as vinyl-n-butyl ether, (meth)acrylic acid alkyl esters, (meth)acrylic acid tetrahydrofurfuryl ester, (meth)acrylic acid dimethylaminoethyl ester, (meth)acrylic acid diethylaminoethyl ester, (meth)acrylic acid glycidyl ester, 2,2,2-trifluoroethyl(meth)acrylate, 2,2,3,3-tetrafluoropropyl (meth)acrylate, (meth)acrylic acid, α-bromo(meth)acrylic acid, α-chloro(meth)acrylic acid, β-furyl(meth)acrylic acid, β-styryl(meth)acrylic acid, maleic acid, maleic anhydride, maleic acid monoesters such as monomethyl maleate, monoethyl maleate and monoisopropyl maleate, fumaric acid, cinnamic acid, α-cyanocinnamic acid, itaconic acid, crotonic acid and propiolic acid. These can be used alone or in combinations of two or more.

Examples of (meth)acrylic acid alkyl esters include methyl (meth)acrylate, ethyl(meth)acrylate, propyl(meth)acrylate, butyl(meth)acrylate, pentyl(meth)acrylate, hexyl(meth)acrylate, heptyl(meth)acrylate, octyl(meth)acrylate, 2-ethylhexyl (meth)acrylate and structural isomers thereof. These can be used alone or in combinations of two or more.

The (A) binder polymer preferably contains a carboxyl group from the standpoint of alkaline development, and can be produced by, for example, radical polymerizing a polymerizable monomer containing a carboxyl group and another polymerizable monomer. The polymerizable monomer containing a carboxyl group is preferably methacrylic acid.

In addition, the (A) binder polymer preferably contains styrene or a styrene derivative as a polymerizable monomer. In order to achieve satisfactory adhesion and separation characteristics, the styrene or styrene derivative used as a copolymerizable component is preferably 3 to 30% by weight, more preferably 4 to 28% by weight, and particularly preferably 5 to 27% by weight relative to all copolymerizable components. If the copolymerized ratio is less than 3% by weight, adhesion tends to be inferior, while if it exceeds 30% by weight, the separated pieces become large and separation time tends to be longer.

The degree of dispersion (weight average molecular weight/number average molecular weight) of the (A) binder polymer is preferably 1.0 to 3.0, and more preferably 1.0 to 2.0. If the degree of dispersion exceeds 3.0, adhesion and resolution tend to decrease. However, values measured by gel permeation chromatography and converted according to a calibration curve using standard polystyrene are used for the weight average molecular weights and number average molecular weights in the present embodiment.

The weight average molecular weight of (A) binder polymer is preferably 5,000 to 300,000, and more preferably 40,000 to 150,000. If the weight average molecular weight is less than 5,000, the developing solution resistance of the photocured resist tends to be lowered, while if it exceeds 300,000, developing time tends to be lengthened.

The acid value of (A) binder polymer is preferably 30 to 200 mg KOH/g, and more preferably 45 to 150 mg KOH/g. If the acid value is less than 30 mg KOH/g, developing time tends to be lengthened, while if it exceeds 200 mg KOH/g, the developing solution resistance of the photocured resist tends to be lowered. In addition, in the case of carrying out solvent development for the developing step, it is preferable to prepare a small amount of the polymerizable monomer having a carboxyl group.

In addition, the (A) binder polymer may also have a photosensitive group as necessary.

These binder polymers can be used alone or two or more types can be used in combination. Examples of binder polymers in the case of using two or more types in combination include two or more types of binder polymers composed of different copolymerizable components, two or more types of binder polymers having different weight average molecular weights, and two or more types of binder polymers having different degrees of dispersion. In addition, the polymer having a multi-mode molecular weight distribution described in Japanese Patent Application Laid-open No. H11-327137 can also be used.

Examples of the (B) photopolymerizable compound having one or more polymerizable ethylenic unsaturated bonds in a molecule thereof include compounds obtained by reacting an α,β-unsaturated carboxylic acid with a polyvalent alcohol, a bisphenol A-type (meth)acrylate compound, compounds obtained by reacting an α,β-unsaturated carboxylic acid with a glycidyl group-containing compound, urethane monomers such as (meth)acrylate compounds having a urethane bond in a molecule thereof, nonylphenoxy polyethyleneoxy acrylates, phthalic acid-based compounds and (meth)acrylic acid alkyl esters. These can be used alone or in combinations of two or more. From the viewpoint of plating resistance and adhesion, a bisphenol A-type (meth)acrylate compound or (meth)acrylate compound having a urethane bond in a molecule thereof is preferably present as an essential component. In addition, the combined use of a photopolymerizable compound having one polymerizable ethylenic unsaturated bond in a molecular thereof and a photopolymerizable compound having two or more polymerizable ethylenic unsaturated bonds in a molecule thereof is preferable in terms of being able to improve sensitivity and resolution.

Examples of compounds obtained by reacting an α,β-unsaturated carboxylic acid with a polyvalent alcohol include polyethylene glycol di(meth)acrylate having 2 to 14 ethylene groups, polypropylene glycol di(meth)acrylate having 2 to 14 propylene groups, polyethylene-polypropylene glycol di(meth)acrylate having 2 to 14 ethylene groups and 2 to 14 propylene groups, trimethylol propane di(meth)acrylate, trimethylol propane tri(meth)acrylate, EO-modified trimethylol propane tri(meth)acrylate, PO-modified trimethylol propane tri(meth)acrylate, EO,PO-modified trimethylol propane tri(meth)acrylate, tetramethylol methane tri(meth)acrylate, tetramethylol methane tetra(meth)acrylate, dipentaerythritol penta(meth)acrylate and dipentaerythritol hexa(meth)acrylate. These can be used alone or in combinations of two or more. In the above-mentioned examples, EO indicates ethylene oxide, an EO-modified compound is that having an ethylene oxide group block structure. In addition, PO indicates propylene oxide, and a PO-modified compound is that having a propylene oxide group block structure.

Examples of the above-mentioned bisphenol A-type (meth)acrylate compounds include 2,2-bis((4-((meth)acryloxy)polyethoxy)phenyl)propanes, 2,2-bis(4-((meth)acryloxypolypropoxy)phenyl)propanes, 2,2-bis(4-((meth)acryloxypolybutoxy)phenyl)propanes and 2,2-bis(4-((meth)acryloxypolyethoxypolypropoxy)phenyl)propanes. Examples of the 2,2-bis(4-((meth)acryloxypolyethoxy)phenyl)propanes include 2,2-bis(4-((meth)acryloxydiethoxy)phenyl)propane, 2,2-bis(4-((meth)acryloxytriethoxy)phenyl)propane, 2,2-bis(4-((meth)acryloxytetraethoxy)phenyl)propane, 2,2-bis(4-((meth)acryloxypentaethoxy)phenyl)propane, 2,2-bis(4-((meth)acryloxyhexaethoxy)phenyl)propane, 2,2-bis(4-(meth))acryloxyheptaethoxy)phenyl)propane, 2,2-bis(4-((meth)acryloxyoctaethoxy)phenyl)propane, 2,2-bis(4-((meth)acryloxynonaethoxy)phenyl)propane, 2,2-bis(4-((meth)acryloxydecaethoxy)phenyl)propane, 2,2-bis(4-((meth)acryloxyundecaethoxy)phenyl)propane, 2,2-bis(4-(meth))acryloxydodecaethoxy)phenyl)propane, 2,2-bis(4-(meth))acryloxytridecaethoxy)phenyl)propane, 2,2-bis(4-(meth))acryloxytetradecaethoxy)phenyl)propane, 2,2-bis(4-(meth))acryloxypentadecaethoxy)phenyl)propane and 2,2-bis(4-(meth))acryloxyhexadecaethoxy)phenyl)propane. In addition, 2,2-bis(4-(methacryloxypentaethoxy)phenyl)propane can be acquired commercially as BPE-500 (product name of Shin-Nakamura Chemical Co., Ltd.), while 2,2-bis(4-(methacryloxypentadecaethoxy)phenyl)propane can be acquired commercially as BPE-1300 (product name of Shin-Nakamura Chemical Co., Ltd.). The number of ethylene oxide groups in a single molecule of the above-mentioned 2,2-bis(4-((meth)acryloxypolyethoxy)phenyl)propanes and 2,2-bis(4-((meth)acryloxypolyethoxypolypropoxy)phenyl)propanes is preferably 4 to 20, and more preferably 8 to 15. These can be used alone or in combinations of two or more.

Examples of the above-mentioned (meth)acrylate compounds having a urethane bond in a molecule thereof include addition reaction products of a (meth)acrylic monomer having an OH group at the β-position and a diisocyanate compound (such as isophorone diisocyanate, 2,6-toluene diisocyanate, 2,4-toluene diisocyanate or 1,6-hexamethylene diisocyanate), tris((meth)acryloxytetraethylene glycol isocyanate)hexamethylene isocyanurate, EO-modified urethane di(meth)acrylate and EO,PO-modified urethane di(meth)acrylate. An example of an EO-modified urethane di(meth)acrylate is UA-11 (product name of Shin-Nakamura Chemical Co., Ltd.). In addition, an example of an EO,PO-modified urethane di(meth)acrylate is UA-13 (product name of Shin-Nakamura Chemical Co., Ltd.). These can be used alone or in combinations of two or more.

Examples of the above-mentioned nonylphenoxy polyethyleneoxy acrylates include nonylphenoxy tetraethyleneoxy acrylate, nonylphenoxy pentaethyleneoxy acrylate, nonylphenoxy hexaethyleneoxy acrylate, nonylphenoxy heptaethyleneoxy acrylate, nonylphenoxy octaethyleneoxy acrylate, nonylphenoxy nonaethyleneoxy acrylate, nonylphenoxy decaethyleneoxy acrylate and nonylphenoxy undecaethyleneoxy acrylate. These can be used alone or in combinations of two or more.

Examples of the above-mentioned phthalic acid-based compounds include γ-chloro-β-hydroxypropyl-β'-(meth)acryloyloxyethyl-o-phthalate and β-hydroxyalkyl-β'-(meth)acryloyloxyalkyl-o-phthalate. These can be used alone or in combinations of two or more.

The above-mentioned (C) photopolymerization initiator has for its essential component a thioxanthone-based compound represented by the above-mentioned general formula (I). The thioxanthone-based compound is used at P parts by weight relative to a total of 100 parts by weight of the above-mentioned components (A) and (B). In general formula (I), $R^1$, $R^2$, $R^3$, $R^4$, $R^5$, $R^6$, $R^7$ and $R^8$ respectively and independently represent a hydrogen atom, a halogen atom or a hydrocarbon group. Examples of halogen atoms include a fluorine atom, chlorine atom and bromine atom, and a chlorine atom is preferable. Preferable examples of hydrocarbon groups include alkyl groups having 1 to 3 carbon atoms and alkenyl groups having 1 to 3 carbon atoms. Examples of alkyl groups having 1 to 3 carbon atoms include a methyl group, ethyl group and propyl group, and an ethyl group is preferable. Examples of alkenyl groups having 1 to 3 carbon atoms include an ethenyl group and a propenyl group. In addition, preferable examples of the above-mentioned thioxanthone-based compounds include compounds in which $R^2$ and $R^4$ are both ethyl groups, compounds in which $R^2$ or $R^4$ is an isopropyl group, compounds in which $R^2$ and $R^4$ are both chlorine atoms and compounds in which $R^2$ is a chlorine atom, with compounds in which $R^2$ and $R^4$ are both ethyl groups being more preferable, and examples of these compounds include 2,4-dichlorothioxanthone, 2,4-diethylthioxanthone and 2,4-diisopropylthioxanthone. In the case of adding the thioxanthone-based compounds as a photopolymerization initiator, storage stability under yellow light is satisfactory.

The above-mentioned blended amount P is suitably selected so that the product R of blended amount P and the film thickness Q (μm) of the photosensitive resin composition layer satisfies the conditions of the following formula (1).

$$25.5 \leq R \leq 79.0 \tag{1}$$

In the case R satisfies the conditions of formula (1), the resulting photosensitive element has superior sensitivity and resolution, and the cross-sectional shape of the developed resist is rectangular. Furthermore, the above-mentioned R is preferably 77.0 or less, more preferably 75.0 or less, even more preferably 69.6 or less, and particularly preferably 68.4 or less. In addition, the above-mentioned R is preferably 28.0 or more, more preferably 30.0 or more, even more preferably 31.2 or more, and particularly preferably 32.4 or more.

In addition, the above-mentioned R more preferably satisfies the conditions of the following formula (2), $$28.0 \leq R \leq 77.0 \tag{2}$$

and particularly preferably satisfies the conditions of the following formula (3).

$$31.2 \leq R \leq 75.0 \tag{3}$$

If the above-mentioned R is less than 25.5, the O.D. value of the photosensitive resin composition layer for light having a wavelength of 400 to 450 nm is small, and since it is unable to adequately absorb light and sensitivity becomes low. If R exceeds 79.0, the O.D. value is high, and although sensitivity is high, since it is difficult for light to reach the bottom portion, curability of the bottom portion is poor and the cross-sectional shape of the developed resist is that of an inverted trapezoid or resolution becomes poor.

In addition, in the case the above-mentioned R satisfies the conditions of formula (1), the O.D. value for light having a wavelength of 405 nm in particular is preferably 0.24 to 0.65 and more preferably 0.26 to 0.62. In the case the O.D. value is within this range, the photosensitive element allows the obtaining of adequate sensitivity and resolution, and the cross-sectional shape of the developed resist is rectangular. If the O.D. value is less than 0.24, since an adequate amount of light for the polymerization reaction cannot be absorbed, sensitivity tends to decrease, while if the O.D. value exceeds 0.65, although sensitivity increases, since it becomes difficult for light to reach the bottom portion, the curability of the bottom portion is poor and the cross-sectional shape of the developed resist is that of an inverted trapezoid or resolution tends to become poor.

The photosensitive resin composition of the present invention can also contain a photopolymerization initiator other than the thioxanthone-based compound. Examples of other photopolymerization initiators that can be added include aromatic ketones such as benzophenone or 2-benzyl-2-dimethylamino-1-(4-morpholinophenyl)-butanone-1,2-methyl-1-[4-(methylthio)phenyl]-2-morpholino-propanone-1, quinones such as alkylanthraquinones, benzoin ether compounds such as benzoin alkyl ethers, benzoin compounds such as benzoin or alkylbenzoins, benzyl derivatives such as benzyl dimethyl ketal, 2,4,5-triaryl imidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer or 2-(p-methoxyphenyl)-4,5-diphenylimidazole dimer, acridine derivatives such as 9-phenylacridine or 1,7-bis(9,9'-acridinyl)heptane, N-phenyl glycine, N-phenyl glycine derivatives and acylphosphine oxide compounds. These can be used alone or in combinations of two or more. Among these, 2,4,5-triaryl imidazole dimmers are preferable they are able to improve adhesion and sensitivity. In addition, substituents of the aryl groups of two 2,4,5-triaryl imidazoles may impart a symmetrical compound by being the same or may impart an asymmetrical compound by being different.

In addition, an acylphosphine oxide compound represented by the following general formula (II) is particularly preferable as a photopolymerization initiator used in combination with the thioxanthone-based compound.

[Chemical Formula 4]

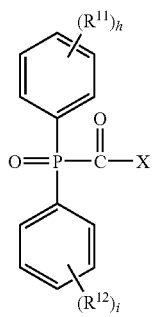

(II)

In formula (II), X, $R^{11}$ and $R^{12}$ respectively and independently represent a monovalent organic group, and h and i respectively and independently represent an integer of 0 to 5. Monovalent organic groups $R^{11}$ and $R^{12}$ are preferably a hydrocarbon group and particularly preferably a hydrocarbon group having 1 to 20 carbon atoms. The hydrocarbon group is preferably an alkyl group, more preferably an alkyl group having 1 to 20 carbon atoms, and even more preferably an alkyl group having 1 to 5 carbon atoms.

In addition, examples of monovalent organic group X include an optionally substituted hydrocarbon group, carboxyl group, alkoxy group or a monovalent substituent obtained by a combination thereof. Examples of optionally substituted hydrocarbon groups (preferably having 1 to 30 carbon atoms) include an optionally substituted aryl group, optionally substituted alkyl group or optionally substituted alkenyl group, and an optionally substituted aryl group is preferable. In addition, although examples of substituents in the optionally substituted hydrocarbon group include an alkyl group, carboxyl group and alkoxy group, an alkyl group is preferable, and an alkyl group having 1 to 5 carbon atoms is more preferable.

An acylphosphine oxide compound represented by the following general formula (III) is preferable for the acylphosphine oxide compound represented by the above-mentioned general formula (II).

[Chemical Formula 5]

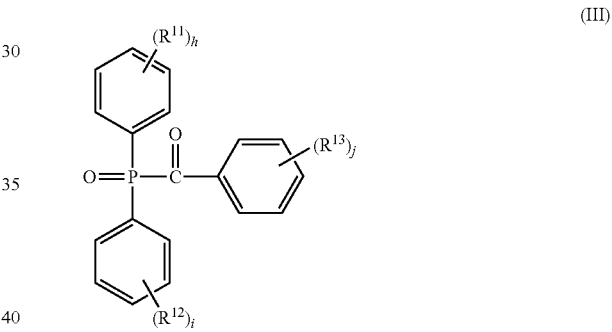

(III)

In formula (III), $R^{11}$, $R^{12}$ and $R^{13}$ independently and respectively represent a monovalent organic group, and h, i and j respectively and independently represent an integer of 0 to 5. Here, a hydrocarbon group is preferable for the monovalent organic group of $R^{11}$, $R^{12}$ and $R^{13}$, and a hydrocarbon group having 1 to 20 carbon atoms is more preferable. This hydrocarbon group is preferably an alkyl group, more preferably an alkyl group having 1 to 20 carbon atoms, and even more preferably an alkyl group having 1 to 5 carbon atoms. In addition, a combination of h, i and j in which h is 0, i is 0 and j is 3 is preferable.

A specific example of an acylphosphine oxide compound represented by the above-mentioned general formula (III) is 2,4,6-trimethylbenzoyl-diphenyl-phosphine oxide.

Furthermore, in the case of using an acylphosphine oxide compound represented by the above-mentioned general formula (II) in combination with a thioxanthone-based compound, the above-mentioned R should be selected to be within the range of 25.5 to 95.5. In this case, above-mentioned R is preferably 90.0 or less, more preferably 75.0 or less, even more preferably 72.0 or less, particularly preferably 69.6 or less, and extremely preferably 68.4 or less. In addition, above-mentioned R is preferably 30.0 or more, more preferably 31.2 or more, even more preferably 32.4 or more, and particularly preferably 32.5 or more.

The following provides an explanation of the content of each component in the photosensitive resin composition.

The content of the above-mentioned component (A) is preferably 40 to 80 parts by weight, and more preferably 45 to 70 parts by weight relative to a total of 100 parts by weight of the above-mentioned components (A) and (B). If this content is less than 40 parts by weight, the photocured resist tends to become brittle, and in the case of forming a photosensitive element, film coatability tends to be inferior, while if this content exceeds 80 parts by weight, sensitivity tends to be inadequate.

The content of the above-mentioned component (B) is preferably 20 to 60 parts by weight and more preferably 30 to 55 parts by weight relative to a total of 100 parts by weight of the components (A) and (B). If this content is less than 20 parts by weight, sensitivity tends to be inadequate, while if this content exceeds 60 parts by weight, the resist tends to become brittle.

The content of the above-mentioned component (C) is preferably 0.1 to 20 parts by weight and more preferably 0.2 to 10 parts by weight relative to a total of 100 parts by weight of the components (A) and (B). If this content is less than 0.1 parts by weight, sensitivity tends to be inadequate, while if this content exceeds 20 parts by weight, absorption on the surface of the composition increases during exposure which tends to cause internal photocuring to be inadequate.

The photosensitive resin composition in the present invention may contain as necessary, for example, a photopolymerizable compound (such as an oxetane compound) having at least one cationic polymerizable cyclic ether group in a molecule thereof, cationic polymerization initiator, dye such as malachite green, photo color developer such as tribromomethyl phenyl sulfone or leuco crystal violet, thermal coloring prevention agent, plasticizer such as p-toluene sulfonamide, pigment, filler, foam breaker, flame retardant, stabilizer, adhesion imparting agent, leveling agent, separation promoter, antioxidant, fragrance, imaging agent or crosslinking agent, at about 0.01 to 20 parts by weight each relative to a total of 100 parts by weight of the components (A) and (B). These can be used alone or in combinations of two or more.

The photosensitive resin composition can be applied, as necessary, as a solution having a solid content of 30 to 60% by weight by dissolving in a solvent such as methanol, ethanol, acetone, methyl ethyl ketone, methyl Cellosolve, ethyl Cellosolve, toluene, N,N-dimethylformamide or propylene glycol monomethyl ether, or a mixed solvent thereof.

In addition, the film thickness of the photosensitive resin composition layer after drying is preferably 1 to 100 μm, more preferably 5 to 60 μm, and even more preferably 10 to 50 μm. If the film thickness is less than 1 μm, coating tends to be difficult industrially, while if the film thickness exceeds 100 μm, the effects of the present invention are diminished and adhesion and resolution tend to decrease.

Figure 2:
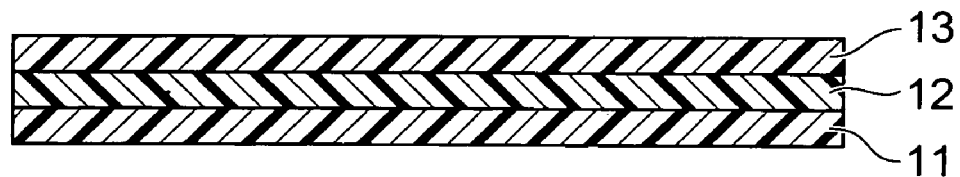
FIG. 2 is a schematic cross-sectional view showing another preferable embodiment of a photosensitive element of the present invention.

As shown in FIG. 1, photosensitive element 1 of the present invention is at least provided with a support 11 and a photosensitive resin composition layer 12 provided on the support 11 and composed of a photosensitive resin composition. However, as shown in FIG. 2, a protective film 13 may be further provided on the opposite side of the side in contact with the support 11 of the photosensitive resin composition layer 12.

A polymer film such as polyethylene terephthalate, polypropylene, polyethylene or polyester film can be used for support (support film) 11. A polymer film such as polyethylene or polypropylene film can be used for the protective film.

The thickness of the polymer film is preferably 1 to 100 μm. A protective film 13 such that the adhesive strength between photosensitive resin composition layer 12 and protective film 13 is less than the adhesive strength between photosensitive resin composition layer 12 and support 11 is preferably for protective film 13, while a low fish-eye film is preferable.

In addition, a support having, for example, an intermediate layer or protective layer such as a cushioning layer, adhesive layer, light-absorbing layer, gas barrier layer may be used for the support on the polymer film.

The above-mentioned photosensitive element can be obtained by applying the photosensitive resin composition on the support and drying. The application can be accomplished by a publicly known process using a roll coater, comma coater, gravure coater, air knife coater, die coater, bar coater or the like. In addition, the drying can be carried out for about 5 to 30 minutes at 70 to 150° C. In addition, the amount of residual organic solvent in the photosensitive resin composition layer is preferably 2% by weight or less from the standpoint of preventing diffusion of the organic solvent in subsequent steps.

The above-mentioned photosensitive element can be stored as is or by, for example, further laminating a protective film on the photosensitive resin composition layer on the opposite side from the side in contact with the support, and winding onto a cylindrical core. Furthermore, winding at this time is preferably such that the support is on the outermost side. It is preferable to install end separators on the ends of the roll-like photosensitive element roll wound onto the core from the standpoint of protecting the ends, and it is preferable to install moisture-resistant end separators from the standpoint of resistance to edge fusion. In addition, packaging by wrapping in low-moisture-permeable black sheets is preferable for the packaging method.

The above-mentioned core is made from a plastic such as polyethylene resin, polypropylene resin, polystyrene resin, polyvinyl chloride resin or ABS resin (acrylonitrile-butadiene-styrene copolymer).

A method for forming a resist pattern using the above-mentioned photosensitive element is a method at least comprising: a laminating step of laminating a photosensitive resin composition layer of a photosensitive element on a substrate for circuit formation, a exposing step of forming an exposed portion by radiating light onto a predetermined portion of the photosensitive resin composition layer, and a developing step of removing the portion other than the exposed portion of the photosensitive resin composition layer.

An example of a method for laminating the photosensitive resin composition layer of the photosensitive element onto a substrate for circuit formation in the laminating step consists of removing the protective film when a protective film is present, followed by bonding the photosensitive resin composition layer onto the substrate for circuit formation at a pressure of about 0.1 to 1 MPa (about 1 to 10 kgf/cm$^2$) while heating at about 70 to 130° C. Furthermore, there are no particular limitations on the above-mentioned laminating conditions, and lamination can also be carried out under reduced pressure. Although the laminated surface is normally a metal surface, there are no particular limitations thereon.

Examples of methods for forming an exposed portion in the exposing step by radiating light onto a predetermined portion of the photosensitive resin composition layer on which lamination has been completed include a mask exposure method through a mask pattern, a laser direct writing method, and a direct writing method in which about 480,000 to 800,000 mirrors measuring roughly 13 to 17 μm on a side are arranged so that the exposure light is in the form of an image by changing the angle of each mirror as necessary. In the case the support is opaque, light is radiated onto the photosensitive resin composition layer after removing the support.

Examples of exposure methods using a direct writing method in which exposure light is in the form of an image by arranging roughly 480,000 to 800,000 mirrors measuring roughly 13 to 17 μm on a side and changing the angle of each mirror as necessary include the Digital Light Processing (DLP) exposure method of Texas Instruments, the Data Direct Imaging System of Pentax, and the Maskless Lithography System of Ball Conductor. Examples of the arrange mirrors that fulfill the central function of the direct writing method include a micro-mirror array, two-dimensional display elements and digital mirror devices (DMD).

A known light source that effectively radiates ultraviolet ray, visible light and so forth is used for the light source of the above-mentioned light, examples of which include a carbon arc lamp, mercury vapor arc lamp, high-pressure mercury lamp, xenon lamp, Ar ion laser and semiconductor laser. Furthermore, in the present invention, the light radiated from the light source is preferably light having a wavelength of 400 to 450 nm, and more preferably light having a wavelength of 400 to 415 nm. In the case of using a light source for the exposure light that emits a large amount of light having a wavelength of 365 nm or less in the case of a mercury lamp, it is preferable to radiate the light after cutting off 90% or more, more preferably 99.0% or more, and particularly preferably 99.5% or more, of the light having a wavelength of 365 nm or less with a filter. An example of a filter that can be used to cut off light having a wavelength of 365 nm or less is the SCF-100S-39L Sharp Cut Filter manufactured by Sigma Koki Co., Ltd. In addition, a laser is preferably used for the light source, while a semiconductor laser diode is used more preferably and a gallium nitride-based semiconductor laser or blue laser is used particularly preferably. A preferable example of a blue laser is a gallium nitride-based blue laser. Moreover, in the case of using a laser light source for the exposure light, it is preferable to radiate light having a wavelength of 400 to 450 nm, more preferably light having a wavelength of 400 to 415 nm, and particularly preferably light having a wavelength of 405 nm. In addition, the exposure method that uses a direct writing method in which the exposure light is in the form of an image by arranging about 480,000 to 800,000 mirrors measuring roughly 13 to 17 μm on a side and changing the angle of each mirror as necessary is preferably carried out with light having a wavelength of 400 to 450 nm, more preferably light having a wavelength of 400 to 415 nm, and particularly preferably light having a wavelength of 400-410 nm.

Figure 3:
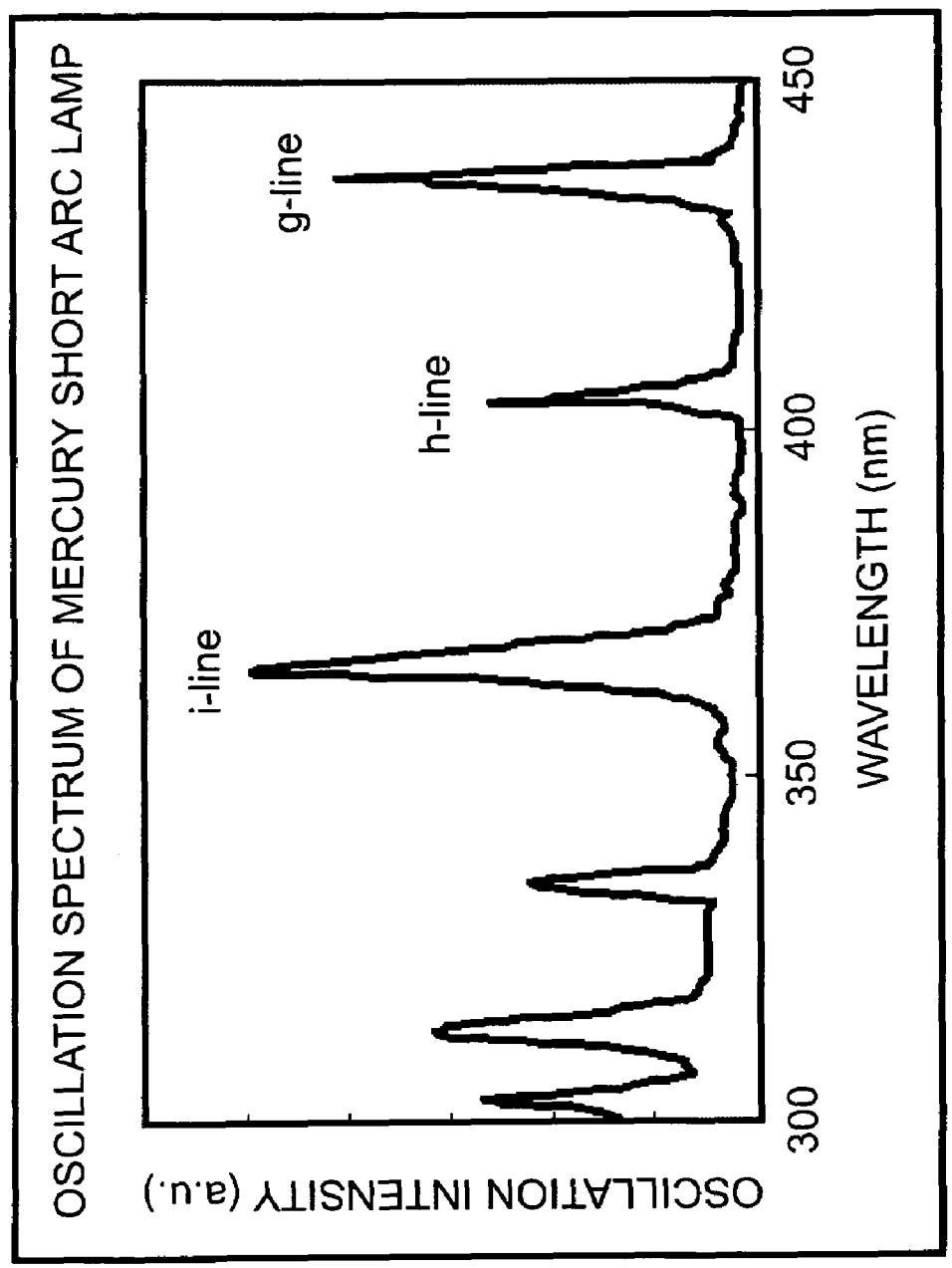
FIG. 3 shows the oscillation spectrum of a mercury lamp light source.

In addition, the light of the light sources listed above is preferably light that is radiated such that the area integrated intensity a at a wavelength of 400 to 450 nm in the oscillation spectrum of the light source is preferably 10 times or more the area integrated intensity b at a wavelength of 300 nm to less than 400 nm. FIG. 3 shows the oscillation spectrum of a mercury lamp light source. In the case of exposing as is using a mercury lamp for the light source, the emitted light has a broad wavelength region as shown in FIG. 3, and light having a wavelength of less than 400 nm in the form of ultraviolet ray centering around a wavelength of 365 nm and which is harmful to the body ends up being radiated. Therefore, when the area integrated intensity of the oscillation spectrum at a wavelength of 300 to less than 400 nm, which is ultraviolet ray that is harmful to the body, is defined as b, and the area integrated intensity of radiated light having a wavelength of 400 to 450 nm is defined as a, then the light having a wavelength of 300 to less than 400 nm is preferably cut off using a cut filter as shown in FIG. 4 so that a is 10 times or more greater than b.

Figure 4:
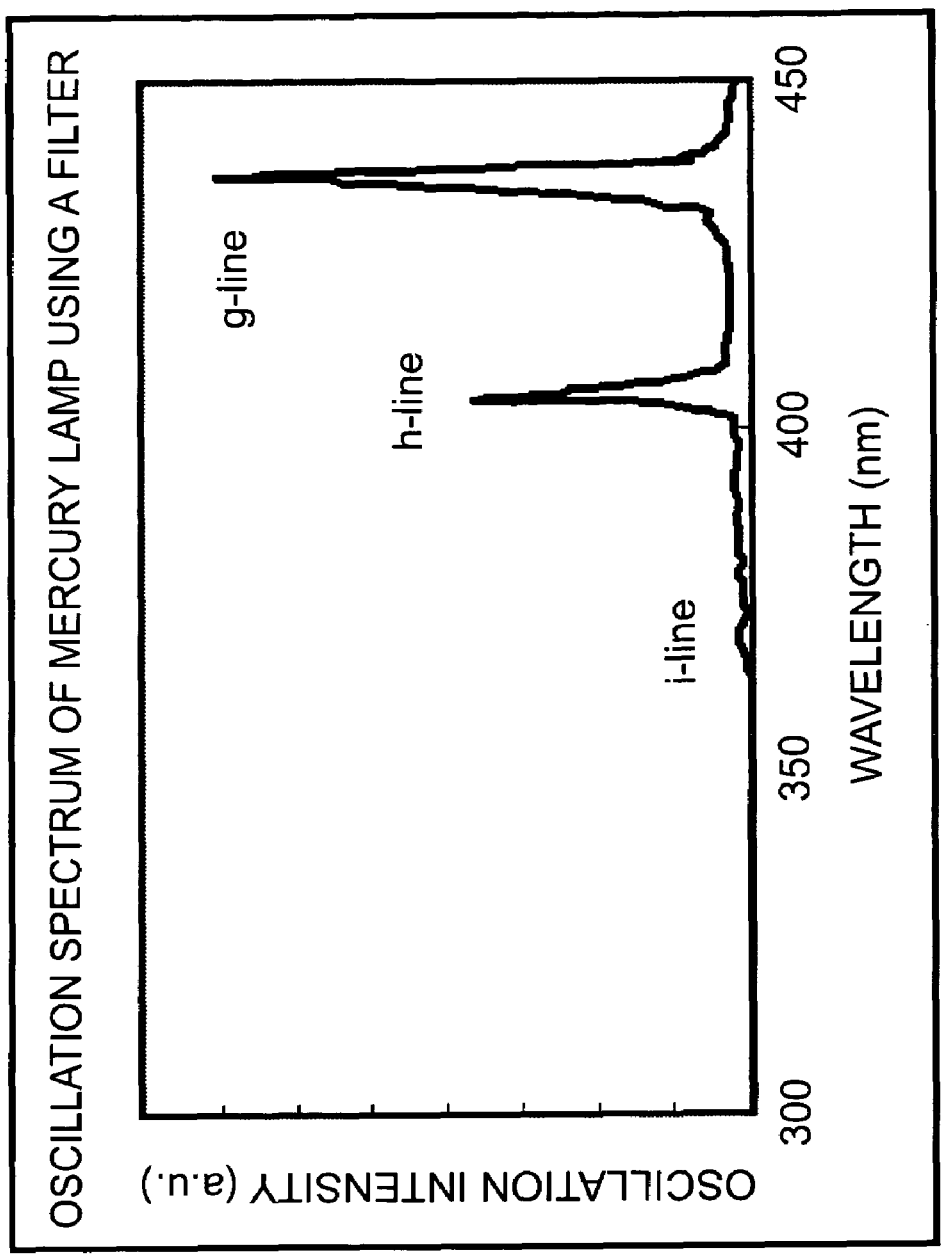
FIG. 4 shows the oscillation spectrum of a mercury lamp light source that uses a filter.

Here, FIG. 4 shows the oscillation spectrum of a mercury lamp light source that uses a filter.

An example of a method for removing a portion other than the exposed portion of the photosensitive resin composition layer in the developing step consists of removing the support when the support being present on the photosensitive resin composition layer, and then removing the portion other than the exposed portion by wet developing with a developing solution such as an alkaline aqueous solution, aqueous developing solution or organic solvent, or by dry developing. This results in the formation of a resist pattern. Examples of the alkaline aqueous solution include a dilute solution of 0.1 to 5% by weight sodium carbonate, a dilute solution of 0.1 to 5% by weight potassium carbonate, a dilute solution of 0.1 to 5% by weight sodium hydroxide and a dilute solution of 0.1 to 5% by weight sodium tetraborate. The pH of the alkaline aqueous solution is preferably within the range of 9 to 11, and the temperature thereof is adjusted to match the developing properties of the photosensitive resin composition layer. In addition, a surfactant, foam breaker or organic solvent and so forth may be mixed into the alkaline aqueous solution.

Examples of developing methods include dipping systems, spraying systems, brushing systems and slapping systems.

Heating to about 60 to 250° C. or exposing at about 0.2 to 10 J/cm² may be carried out as necessary as treatment following developing and used to further cure the resist pattern.

The above-mentioned resist pattern formation method enables satisfactory exposure and development as a result of using the above-mentioned photosensitive element, sensitivity and resolution are superior, and a resist pattern can be formed in which the target resist shape is obtained.

A printed wiring board production method that uses the above-mentioned photosensitive element comprising: carrying out etching treatment or plating treatment on the surface of a substrate for circuit formation by using a resist pattern formed by the above-mentioned resist pattern formation method as a mask. When etching a metal surface, a solution such as a cupric chloride solution, ferric chloride solution or alkaline etching solution can be used. Examples of the plating methods include copper plating, solder plating, nickel plating and gold plating.

Next, the resist pattern is separated with, for example, an alkaline aqueous solution that is stronger than the alkaline aqueous solution used for developing. Examples of this strong alkaline aqueous solution include a 1 to 10% by weight aqueous sodium hydroxide solution and a 1 to 10% by weight aqueous potassium hydroxide solution. Examples of separation systems include dipping system and spraying system. In addition, the printed circuit board on which the resist pattern is formed may be a multilayered printed circuit board and may have small diameter through holes.

The above-mentioned printed wiring board production method allows the obtaining of high-density printed wiring boards at a high throughput as a result of using the above-mentioned resist pattern formation method.

EXAMPLES

Although the following provides a more detailed explanation of preferable examples of the present invention, the present invention is not limited to these examples.

First, each of the components shown in Table 1 were mixed in the blended amounts shown to obtain solutions of the photosensitive resin compositions of Examples 1 to 3 and Comparative Examples 1 and 2. Furthermore, the blended amounts of 2,4-diethylthioxanthone used for component (C) are shown in Table 2.

TABLE 1

| Materials | | Blended Amounts |
|---|---|---|
| Component (A) | Copolymer comprised of methacrylic acid, methyl methacrylate and styrene at a weight ratio of 25:50:25, having a degree of dispersion of 2.19, weight average molecular weight of 55,000 and solid content acid value of 163.1 mg KOH/g, dissolved in a 2-methoxyethanol and toluene solution (weight ratio: 3/2) to a non-volatile content of 45% by weight | Solid content: 56 g |
| Component (B) | 2,2-bis(4-(methacryloxypentaethoxy) phenyl)propane | 44 g |
| Component (C) | 2-(o-chlorophenyl)-4,5-diphenylimidazole dimer | 3.2 g |
| | 2,4-diethylthioxanthone (compound in which $R^2$ and $R^4$ are both ethyl groups in general formula (I)) | Predetermined amount (see Table 2) |
| Color developer | Leuco crystal violet | 0.4 g |
| Dye | Malachite green | 0.05 g |
| Solvent | Acetone | 10 g |
| | Toluene | 7 g |
| | N,N-dimethylformamide | 3 g |
| | Methanol | 3 g |

TABLE 2

| | Example 1 | Example 2 | Example 3 | Comparative Example 1 | Comparative Example 2 |
|---|---|---|---|---|---|
| Blended amount of 2,4-diethylthioxanthone (g): P | 1.3 | 2.1 | 2.9 | 0.9 | 3.3 |

Next, solutions of the resulting photosensitive resin compositions were uniformly applied to a polyethylene terephthalate film having a thickness of 16 μm (product name: GS-16, Teijin Co., Ltd.) and dried for 10 minutes with a hot air convection dryer at 100° C. to obtain a photosensitive element. The layer thickness of the photosensitive resin composition layer was 24 μm.

The O.D. value of the photosensitive resin composition layer relative to the exposure wavelength was measured using a UV spectrophotometer (product name: U-3310 Spectrophotometer, Hitachi, Ltd.). The photosensitive element composed of a support film and photosensitive resin composition layer was placed on the measuring side, the support film was placed on the reference side, and optical absorbance was measured continuously over a wavelength of 550 to 300 nm followed by reading the values for light at a wavelength of 365 nm and light at a wavelength of 405 nm.

On the other hand, the copper surface of a copper-clad laminated substrate (product name: MCL-E-67, Hitachi Chemical Co., Ltd.) comprised of a glass epoxy material laminated on both sides with copper foil (thickness: 35 μm) was polished using polishing machine (product of Sankei Co., Ltd.) equipped with a #600 brush or equivalent followed by rinsing with water and drying in an air flow. Next, after heating the copper-clad laminated substrate to 80° C., the above-mentioned photosensitive element was laminated at 120° C. and a pressure of 0.4 MPa so that its photosensitive resin composition layer adhered to the surface of the copper-clad laminated substrate.

When the copper-clad laminated substrate laminated with the photosensitive element had cooled to 23° C., a photo tool having a 41-step tablet in which the concentration range was 0.00 to 2.00, the concentration step was 0.05, and tablet size was 20 mm×187 mm and the size of each step was 3 mm×12 mm, and a photo tool having a wiring pattern in which the line width/space width is 6/6 to 35/35 (unit: μm) used as the negative for evaluating resolution, were adhered to the polyethylene terephthalate side, after which the SCF-100S-39L Sharp Cut Filter manufactured by Sigma Koki Co., Ltd. for cutting off 99.5% or more of light having a wavelength of 365 nm or less was placed thereon, followed by exposing so that the number of residual steps following development of the 41-step tablet was 14, 17 and 20 steps using a parallel light exposure system (product name: EXM-1201, Orc Manufacturing Co., Ltd.) that uses a 5 kW short arc lamp for the light source. The amount of exposure at which the number of residual steps following development of the 41-step tablet was 17 was defined as the sensitivity. Furthermore, illuminance was measured for the light that passed through the Sharp Cut Filter by using the UIT-101 UV Illuminance Meter manufactured by Ushio Inc. applying a probe compatible with a wavelength of 405 nm, and the amount of exposure was defined as the product of illuminance and exposure time.

Next, the polyethylene terephthalate film was removed followed by spraying for 24 seconds with a 1.0% by weight aqueous sodium carbonate solution at 30° C. to remove the portion other than the exposed portion.

Resolution was evaluated according to the smallest value for the width of the space between lines that is formed that enables the portion other than the exposed portion to be cleanly removed by developing treatment but without occurrence of snaking or chipping of the lines. The evaluations of sensitivity and resolution are better the smaller the value.

The cross-sectional shape of the resist after developing was observed using the S-500A Scanning Electron Microscope manufactured by Hitachi, Ltd. The cross-sectional shape of the resist preferably approximates a rectangle.

The data for the O.D. values, sensitivity, resolution and cross-sectional shape of the resist of the photosensitive elements of Examples 1 to 3 and Comparative Examples 1 and 2 are shown in Table 3. Furthermore, the blended amounts P [g] of the 2,4-diethylthioxanthone contained in each of the photosensitive resin compositions, the film thickness Q [μm] of the photosensitive resin composition layers of the photosensitive elements, and their product R are also shown for reference purposes.

TABLE 3

| | Ex. 1 | Ex. 2 | Ex. 3 | Comp. Ex. 1 | Comp. Ex. 2 |
|---|---|---|---|---|---|
| Blended amount of 2,4-diethylthioxanthone (g): P | 1.3 | 2.1 | 2.9 | 0.9 | 3.3 |
| Film thickness (μm): Q | 24 | 24 | 24 | 24 | 24 |
| R (= P × Q) | 31.2 | 50.4 | 69.6 | 21.6 | 79.2 |

TABLE 3-continued

|  |  | Ex. 1 | Ex. 2 | Ex. 3 | Comp. Ex. 1 | Comp. Ex. 2 |
|---|---|---|---|---|---|---|
| O.D. value | 365 nm | 0.62 | 0.96 | 1.31 | 0.47 | 1.47 |
|  | 405 nm | 0.28 | 0.43 | 0.59 | 0.22 | 0.67 |
|  | Sensitivity (mJ/cm$^2$) | 1270 | 975 | 802 | 1498 | 740 |
| Resolution (μm) | ST = 14/41 | 15 | 15 | 18 | 18 | 20 |
|  | ST = 17/41 | 18 | 18 | 20 | 22 | 20 |
|  | ST = 20/41 | 20 | 18 | 22 | 25 | 25 |
|  | Resist shape | Rectangular | Rectangular | Rectangular | Rectangular | Inverted trapezoid |

Next, each of the components shown in Table 4 were blended in the blended amounts shown in the same table to obtain solutions of the photosensitive resin compositions of Examples 4 to 6 and Comparative Examples 3 and 4. Furthermore, the blended amounts of the 2,4-diethylthioxanthone used for component (C) are shown in Table 6.

TABLE 4

| Materials | | Blended Amounts |
|---|---|---|
| Component (A) | Copolymer comprised of methacrylic acid, methyl methacrylate and styrene at a weight ratio of 25:47:28 and having a degree of dispersion of 2.19 and weight average molecular weight of 25,000 | Solid content: 56 g |
| Component (B) | 2,2-bis(4-(methacryloxypentaethoxy) phenyl)propane | 44 g |
| Component (C) | 2-(o-chlorophenyl)-4,5-diphenylimidazole dimer | 3.7 g |
|  | 2,4-diethylthioxanthone (compound in which $R^2$ and $R^4$ are both ethyl groups in general formula (I)) | Predetermined amount (see Table 6) |
| Color developer | Leuco crystal violet | 0.4 g |
| Dye | Malachite green | 0.05 g |
| Solvent | Acetone | 10 g |
|  | Toluene | 7 g |
|  | Methanol | 3 g |

In addition, each of the components shown in Table 5 were blended in the blended amounts shown in the same table to obtain solutions of the photosensitive resin compositions of Example 7 and Comparative Examples 5 and 6. Furthermore, the blended amounts of the 2,4-diethylthioxanthone used for component (C) are shown in Table 7.

TABLE 5

| Materials | | Blended Amounts |
|---|---|---|
| Component (A) | Copolymer comprised of methacrylic acid, methyl methacrylate and styrene at a weight ratio of 25:47:28 and having a degree of dispersion of 2.19 and weight average molecular weight of 25,000 | Solid content: 56 g |
| Component (B) | 2,2-bis(4-(methacryloxypentaethoxy) phenyl propane) | 44 g |
| Component (C) | 2,4,6-trimethylbenzoyl-diphenyl-phosphine oxide | 5.0 g |
|  | 2,4-diethylthioxanthone (compound in which $R^2$ and $R^4$ are both ethyl groups in general formula (I)) | Predetermined amount (see Table 7) |
| Color developer | Leuco crystal violet | 0.4 g |
| Dye | Malachite green | 0.05 g |
| Solvent | Acetone | 10 g |
|  | Toluene | 7 g |
|  | Methanol | 3 g |

Next, solutions of the resulting photosensitive resin compositions of Examples 4 to 7 and Comparative Examples 3 to 6 were uniformly applied to a polyethylene terephthalate film having a thickness of 16 μm (product name: GS-16, Teijin Co., Ltd.) and dried for 10 minutes with a hot air convection dryer at 100° C. to obtain a photosensitive element. The layer thickness of the photosensitive resin composition layer was 25 μm.

The O.D. value of the photosensitive resin composition layer in the resulting photosensitive element relative to the exposure wavelength was measured in the same manner as Example 1. In addition, sensitivity, resolution and resist shape were evaluated in the same manner as Example 1 with the exception of using the resulting photosensitive elements. Furthermore, measurement of illuminance for Examples 4 to 7 and Comparative Examples 3 to 6 was carried out by using a combination of the UIT-150 UV Integrating Photometer manufactured by Ushio Inc. and the UVD-S405 Photoreceiver Detector manufactured by Ushio Inc. instead of the UIT-101 UV Illuminance Meter manufactured by Ushio Inc.

The O.D. value, sensitivity, resolution and cross-sectional shape of the resist in the photosensitive elements of Examples 4 to 7 and Comparative Examples 3 to 6 are shown in Tables 6 and 7. Furthermore, the blended amounts P [g] of the 2,4-diethylthioxanthone contained in each of the photosensitive resin compositions, the film thickness Q [μm] of the photosensitive resin composition layers of the photosensitive elements, and their product R are also shown for reference purposes.

TABLE 6

| Parameter | Ex. 4 | Ex. 5 | Ex. 6 | Comp. Ex. 3 | Comp. Ex. 4 |
|---|---|---|---|---|---|
| Blended amount of 2,4-diethylthioxanthone (g): P | 1.3 | 2.1 | 2.9 | 0.9 | 4 |

TABLE 6-continued

| Parameter | | Ex. 4 | Ex. 5 | Ex. 6 | Comp. Ex. 3 | Comp. Ex. 4 |
|---|---|---|---|---|---|---|
| | Film thickness (μm): Q | 25 | 25 | 25 | 25 | 25 |
| | R (= P × Q) | 32.5 | 52.5 | 72.5 | 22.5 | 100 |
| O.D. value | 365 nm | 0.62 | 0.96 | 1.31 | 0.47 | 1.79 |
| | 405 nm | 0.28 | 0.43 | 0.59 | 0.24 | 0.86 |
| | Sensitivity (mJ/cm$^2$) | 493 | 382 | 296 | 542 | 216 |
| Resolution (μm) | ST = 14/41 | 10 | 15 | 15 | 18 | 20 |
| | ST = 17/41 | 15 | 15 | 18 | 18 | 20 |
| | ST = 20/41 | 18 | 18 | 20 | 20 | 25 |
| | Resist shape | Rectangular | Rectangular | Rectangular | Rectangular | Inverted trapezoid |

TABLE 7

| Parameter | | Ex. 7 | Comp. Ex. 5 | Comp. Ex. 6 |
|---|---|---|---|---|
| Blended amount of 2,4-diethylthioxanthone (g): P | | 3 | 1 | 5 |
| Film thickness (μm): Q | | 25 | 25 | 25 |
| R (= P × Q) | | 75 | 25 | 125 |
| O.D. value | 365 nm | 1.38 | 0.51 | 1.82 |
| | 405 nm | 0.61 | 0.31 | 0.92 |
| Sensitivity (mJ/cm$^2$) | | 296 | 542 | 216 |
| Resolution (μm) | ST = 14/41 | 15 | 18 | 20 |
| | ST = 17/41 | 18 | 18 | 20 |
| | ST = 20/41 | 20 | 20 | 25 |
| Resist shape | | Rectangular | Rectangular | Inverted trapezoid |

As can be understood from the results shown in the tables above, Examples 4 to 7 demonstrated superior sensitivity and resolution and the shape of the resist was roughly rectangular even though component (A) and film thickness were different from Examples 1 to 3. Furthermore, although the sensitivity in Examples 4 to 7 is lower than that in Examples 1 to 3, this is believed to be due to the use of a different measuring instrument for measuring illuminance and the use of a different blended amount of component (C).

INDUSTRIAL APPLICABILITY

The photosensitive element of the present invention demonstrates superior sensitivity and resolution with respect to exposure by light having a wavelength of 400 to 450 nm in particular, and the cross-sectional shape of the resist after developing is rectangular. Thus, the use of the photosensitive element of the present invention enables the production of printed wiring boards to be carried out suitably.

The invention claimed is:

1. A photosensitive element at least comprising:
a support; and
a photosensitive resin composition layer provided on said support and composed of a photosensitive resin composition containing (A) a binder polymer which contains 3 to 30% by weight, relative to all copolymerizable components, of styrene or a styrene derivative as a copolymerizable component, (B) a photopolymerizable compound having one or more polymerizable ethylenic unsaturated bonds in a molecule thereof, and (C) a photopolymerization initiator; wherein, the photosensitive resin composition contains a thioxanthone-based compound represented by the following chemical formula (I) as the component (C):

[Chemical Formula I]

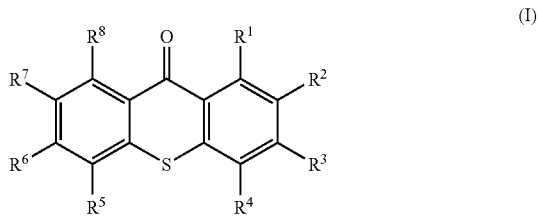

(I)

(in formula (I), $R^1, R^2, R^3, R^4, R^5, R^6, R^7$ and $R^8$ respectively and independently represent a hydrogen atom, halogen atom or hydrocarbon group), and also contains as the (C) photopolymerization initiator an acylphosphine oxide compound represented by the following chemical formula (II):

[Chemical Formula II]

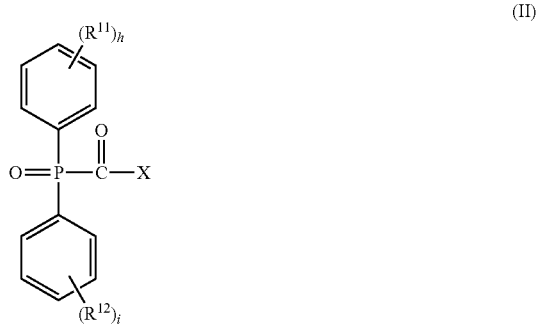

(II)

(in formula (II), X, $R^{11}$ and $R^{12}$ respectively and independently represent a monovalent organic group, and h and i respectively and independently represent an integer of 0 to 5 and when the parts by weight of the thioxanthone-based compound relative to 100 parts by weight for the total weight of the component (A) and the component (B) is taken to be P, and the film thickness of the photosensitive resin composition layer is taken to be Q (μm), then R, which is the product of P and Q, satisfies the condition of the following formula (1)

$$25.5 \leq R \leq 79.0$$ (1), the photosensitive element having a property of photosensitivity to light at a wavelength in a range of 400 to 415 nm.

2. The photosensitive element according to claim 1, wherein the weight average molecular weight of the (A) binder polymer is 5,000 to 300,000.

3. The photosensitive element according to claim 1, wherein the (B) photopolymerizable compound has a bisphenol A-type (meth)acrylate compound as an essential component thereof.

4. The photosensitive element according to claim 1, wherein the (B) photopolymerizable compound has a compound having one ethylenic unsaturated bond in a molecule thereof and a compound having two or more ethylenic unsaturated bonds in a molecule thereof as essential components thereof.

5. The photosensitive element according to claim 1, wherein the (C) photopolymerization initiator also contains a 2,4,5-triarylimidazole dimer.

6. The photosensitive element according to claim 1, wherein the acylphosphine oxide compound represented by the general formula (II) is an acylphosphine oxide compound represented by the following chemical formula (III):

[Chemical Formula III]

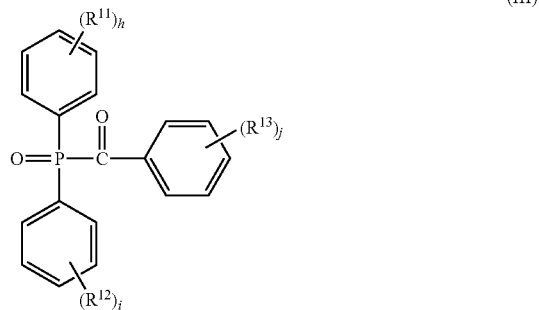

(in formula (III), $R^{11}$, $R^{12}$ and $R^{13}$ respectively and independently represent a monovalent organic group, and h, i and j respectively and independently represent an integer of 0 to 5).

7. The photosensitive element according to claim 1, wherein R satisfies the condition of the following formula (2)

$$28.0 \leq R \leq 77.0 \quad (2).$$

8. The photosensitive element according to claim 1, wherein R satisfies the condition of the following formula (3)

$$31.2 \leq R \leq 75.0 \quad (3).$$

9. The photosensitive element according to claim 1, that is exposed to light in which the area integrated intensity a at a wavelength of 400 to 450 nm in the oscillation spectrum of a light source is 10 times or more the area integrated intensity b at a wavelength of 300 nm to less than 400 nm.

10. The photosensitive element according to claim 1, that is exposed to light emitted from a gallium nitride-based semiconductor laser.

11. The photosensitive element according to claim 1, that is exposed to light emitted from a blue laser.

12. The photosensitive element according to claim 1, that is exposed to light in which 90% or more of light having a wavelength of 365 nm or less emitted by the light source is cut off.

13. The photosensitive element according to claim 1, that is exposed by a direct writing method in which exposure light is in the form of an image by arranging a plurality of mirrors and changing the angle of each mirror as necessary.

14. A resist pattern formation method at least comprising:
a laminating step of laminating a photosensitive resin composition layer of the photosensitive element according to claim 1 on a substrate for circuit formation;
an exposing step of forming an exposed portion by radiating light onto a predetermined portion of the photosensitive resin composition layer; and
a developing step of removing the portion other than the exposed portion of the photosensitive resin composition layer.

15. A printed wiring board production method comprising: carrying out etching treatment or plating treatment on a substrate for circuit formation on which a resist pattern has been formed by the resist pattern formation method according to claim 14.

16. The photosensitive element according to claim 2, wherein the (B) photopolymerizable compound has a bisphenol A-type (meth)acrylate compound as an essential component thereof.

17. The photosensitive element according to claim 16, wherein the (B) photopolymerizable compound has a compound having one ethylenic unsaturated bond in a molecule thereof and a compound having two or more ethylenic unsaturated bonds in a molecule thereof as essential components thereof.

18. The resist pattern formation method according to claim 14, wherein said light radiated upon said photosensitive resin layer during said exposing step has a wavelength in a range of 400 to 450 nm.

19. The photosensitive element according to claim 1, wherein the styrene or styrene derivative included in said binder polymer is styrene.

* * * * *